United States Patent [19]

Inoue et al.

[11] Patent Number: 5,355,384
[45] Date of Patent: Oct. 11, 1994

[54] SEMICONDUCTOR LASER ELEMENT

[75] Inventors: Yuichi Inoue, Tsukuba; Kenji Shimoyama, Tsuchiura; Itaru Sakamoto, Tsuchiura; Hideki Goto, Tsuchiura, all of Japan

[73] Assignee: Mitsubishi Kasei Corporation, Tokyo, Japan

[21] Appl. No.: 128,579

[22] Filed: Sep. 29, 1993

[30] Foreign Application Priority Data

Sep. 29, 1992 [JP] Japan .................. 4-260321

[51] Int. Cl.$^5$ .............................................. H01S 3/19
[52] U.S. Cl. ...................................... 372/46; 372/45
[58] Field of Search ................................. 372/46, 45

[56] References Cited

U.S. PATENT DOCUMENTS

| | | | |
|---|---|---|---|
| 4,371,966 | 2/1983 | Seifres et al. | 372/45 |
| 4,706,254 | 11/1987 | Nejim et al. | 372/46 |
| 4,928,285 | 5/1990 | Kushibe et al. | 372/45 |
| 5,212,113 | 5/1993 | Azoulay et al. | 437/107 |

FOREIGN PATENT DOCUMENTS

| | | |
|---|---|---|
| 0044571 | 1/1982 | European Pat. Off. . |
| 0477096 | 3/1992 | European Pat. Off. . |
| 0503211 | 9/1992 | European Pat. Off. . |
| 2493616 | 5/1982 | France . |
| 0041741 | 3/1980 | Japan .................. 372/46 |
| 2231784 | 9/1990 | Japan . |

OTHER PUBLICATIONS

Patent Abstracts of Japan, vol. 11, No. 75 Mar. 6 1987 & JP-A-61-232 297 (NEC) Oct. 16, 1986 (Abstract).
Sixth International Conference on Metalorganic Vapor Phase Epitaxy, Cambridge, Mass., Jun. 8–11,1992; *Journal of Crystal Growth*, Shimoyama et al: "Novel Selective Area Growth of AlGaAs and AlAs with HCl Gas by MOVPE," pp. 235–242.
*Journal of Applied Physics*, vol. 56, No. 9, Nov. 1, 1984, New York, pp. 2491–2496; Ohtoshi et al: "High–Power Visible GaAlAs Lasers with Self–Aligned Strip Buried Heterostructure".

*Primary Examiner*—Georgia Y. Epps
*Attorney, Agent, or Firm*—Nixon & Vanderhye

[57] ABSTRACT

Disclosed herein is a semiconductor laser element comprising a first cladding layer, an optical guiding layer, an active layer and a second cladding layer disposed in this order or in reverse order on a semiconductor substrate, a refractive index of the optical guiding layer being larger than both refractive indexes of the first and second cladding layers, and a refractive index of the optical guiding layer is smaller than that of the active layer but larger than that of the first cladding layer, and a burying layer having a refractive index smaller than that of at least one of the first and second cladding layers being disposed on side faces other than laser-emitting faces of the optical guiding layer and the active layer.

12 Claims, 4 Drawing Sheets

SEMICONDUCTOR LASER ELEMENT

BACKGROUND OF THE INVENTION

The present invention relates to a semiconductor laser element used for optical information processing, optical communication, etc.

It is known that the semiconductor laser performance can be enhanced by efficiently confining light in the active region. In the semiconductor laser elements of a multilayer structure, therefore, there have been employed the specific laminated structures such as double heterostructure (DH), separate confinement structure (SCH) and large optical cavity (LOC) for confining light in the direction vertical to the layers.

With the conventional crystal growing techniques such as LPE and MOCVD, however, it is difficult to selectively grow as a burying layer, a layer having a refractive index relatively small in comparison with the laminated layers for efficiently confining light in the direction parallel to the layers. Especially, in the case of AlGaAs-based semiconductor laser, although a semiconductor layer having a relatively small refractive index in comparison with an active layer could be formed as the burying layer, it was impossible to form as the burying layer, a semiconductor layer having a refractive index smaller than that of a cladding layer. It is therefore, for example, infeasible to confine light in the direction parallel to the laminations in the portion of the cladding layer, whereby there are disadvantages that a loss in the cavity is large and an internal quantum efficiency is low.

From studies by the present inventors on the subject matter, it has been found a technique for forming a burying layer in an LOC structure which is one of the lamination structures capable of efficiently confining light in the direction vertical to the layers and which comprises a first cladding layer, an optical guiding layer, an active layer and a second cladding layer formed on a substrate in this order or in reverse order, the burying layer being a semiconductor layer having a smaller refractive index than that of the cladding layer, and being disposed to side faces other than laser-emitting faces of the active layer and the optical guiding layer. The present invention was attained on the basis of this finding.

SUMMARY OF THE INVENTION

In a first aspect of the present invention, there is provided a semiconductor laser element comprising a first cladding layer, an optical guiding layer, an active layer and a second cladding layer disposed in this order or in reverse order on a semiconductor substrate, a refractive index of the optical guiding layer being larger than both refractive indexes of the first and second cladding layers, and a refractive index of the optical guiding layer is smaller than that of the active layer but larger than that of the first cladding layer, and a burying layer having a refractive index smaller than that of at least one of the first and second cladding layers being disposed on side faces other than laser-emitting faces of the optical guiding layer and the active layer.

In a second aspect of the present invention, there is provided a process for producing a semiconductor laser element as defined in the first aspect, which comprises laminating a first cladding layer, an optical guiding layer, an active layer and a second cladding layer in this order or in reverse order on a semiconductor substrate, providing a mask on the laminated layers, carrying out etching, and forming a burying layer in the etched out portion, a small amount of an etching gas being flowed together with a layer-forming material gas continuously or intermittently during the forming of the burying layer.

DETAILED DESCRIPTION OF THE INVENTION

In the semiconductor laser element according to the present invention, a first cladding layer, an optical guiding layer, an active layer and a second cladding layer are laminated in this order or in reverse order on a semiconductor substrate, and further a burying layer is disposed to the side faces other than laser-emitting faces of the optical guiding layer and active layer. The refractive index of the active layer is smaller than both refractive indexes of the first and second cladding layers, and the refractive index of the optical guiding layer is smaller than that of the active layer but larger than that of the first cladding layer. The above structure is a so-called buried-stripe heterostructure in which LOC structure is used.

According to the present invention, the refractive index of the burying layer is smaller than that of at least one of the first and second cladding layers. This relation of refractive indexes is conducive to efficient confinement of laser light in both the direction vertical to the laminations and the direction parallel thereto. Preferably, the refractive index of the burying layer is smaller than that of the first cladding layer, i.e., the cladding layer contacting to the optical guiding layer, and more preferably smaller than both refractive indexes of the first and second cladding layers.

Figure 1:
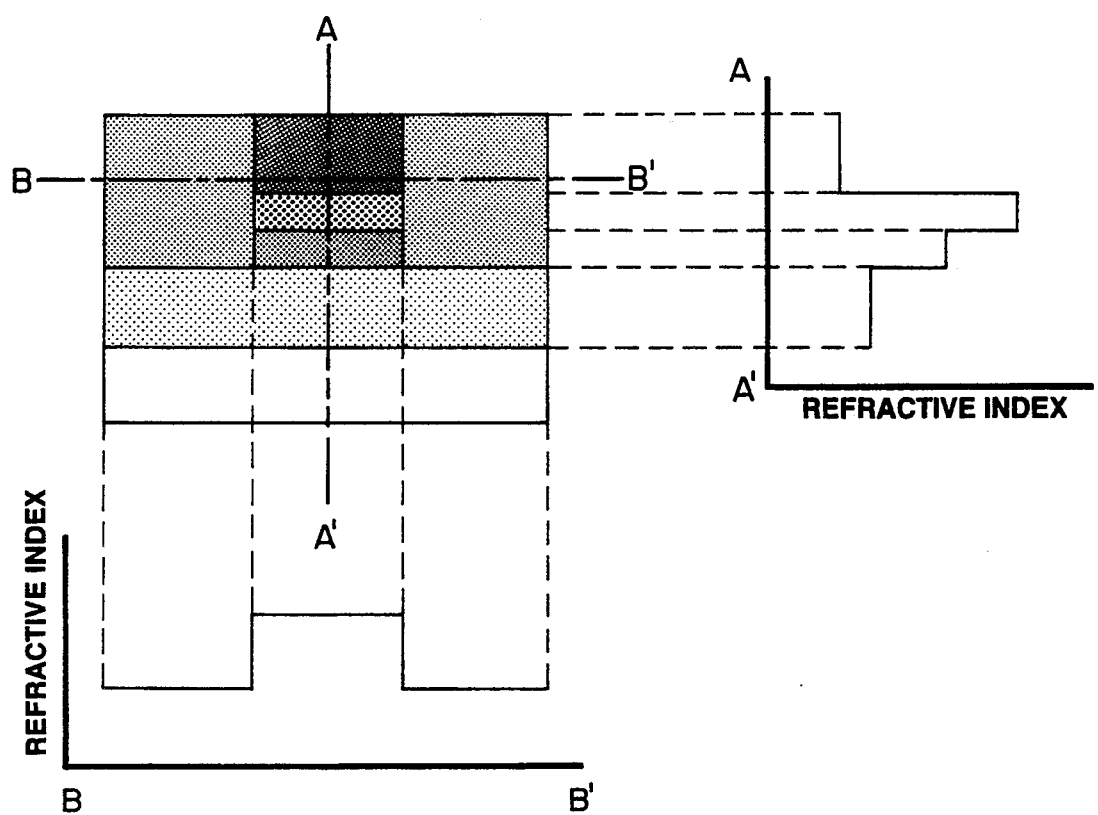
FIG. 1 is a schematic illustration of a typical laser element structure according to the present invention.

The above-described basic structure of the present invention and a typical example of refractive index distribution are schematically illustrated in FIG. 1.

Referring to the structure shown in FIG. 1, the refractive index of the burying layer is smaller than that of the first or second cladding layer. Preferably it is smaller than that of the first cladding layer, more preferably smaller than both refractive indexes of the first and second cladding layers.

Preferably, the burying layer is disposed to side faces of the optical guiding layer, the active layer and at least one of the cladding layers. In this case, the refractive index of the buried cladding layer is preferably smaller than that of the burying layer.

More preferably, the burying layer is disposed to side faces of the optical guiding layer, the active layer and both of the cladding layers The burying layer ordinarily has an energy gap larger than that of the active layer.

As variations the structure of the semiconductor laser element of the present invention, the semiconductor substrate may be constituted by a plural number of semiconductor layers, or a semiconductor layer may be additionally disposed to the side opposite to the optical guiding layer, of the first cladding layer or the side opposite to the active layer, of the second cladding layer. Further, the active layer may be composed of a plural number of semiconductor layers to constitute, for instance, a quantum well structure. Also, the burying layer may have a multilayer structure. In this case, maximum of refractive indexes of the layers is smaller than that of at least one of the cladding layers.

Preferably, the refractive index of the optical guiding layer is larger than that of the second cladding layer.

In case that the first cladding layer, the optical guiding layer, the active layer and the second cladding layer are laminated in this order on a semiconductor substrate, the first cladding layer and the optical guiding layer are of the same electroconductive type as the semiconductor substrate, and the second cladding layer is of the other electroconductive type. On the other hand, in case that these layers are laminated in reverse order on a semiconductor substrate, the second cladding layer is of the same electroconductive type as the substrate, and the first cladding layer and the optical guiding layer are of the other electroconductive type.

Refractive index is usually controlled by crystal mixing of each layer. The semiconductors used for the first cladding layer, the optical guiding layer, the active layer and the second cladding layer in the semiconductor laser element of the present invention are not specified, but usually AlGaAs-based semiconductors or AlGaInP-based semiconductors are used. The former is preferred.

As the material of the semiconductor substrate, GaAs, GaP and the like are usually used.

In the following, the present invention is described in detail by taking the case of its application to an AlGaAs-based semiconductor laser element which is widely used at present. The respective semiconductor layers are constituted as described below.

Figure 2:
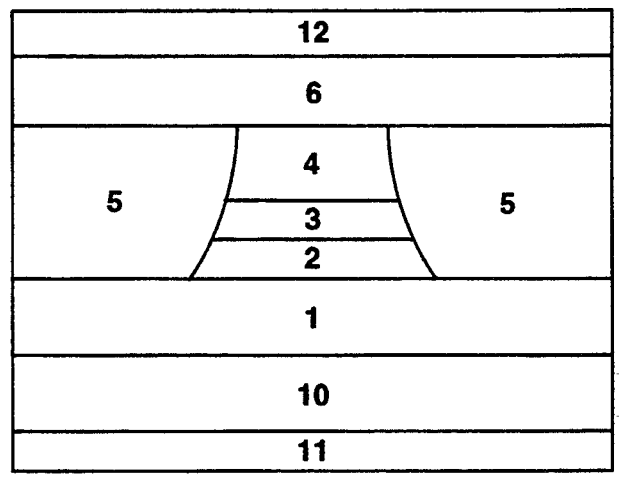
FIG. 2 is a schematic sectional view of a laser element according to the Example 1 of the present invention.

A schematic sectional view of an AlGaAs-based semiconductor laser element is shown in FIG. 2. This is identical with the semiconductor laser element produced in the Example 1 of the present invention. Hereinafter, the present invention is described in accordance with the element shown in FIG. 2.

On an n-GaAs substrate 10 are laminated a cladding layer 1 composed of n-$Al_xGa_{1-x}As$ ($0.2<x<0.7$), an optical guiding layer 2 composed of n-$Al_yGa_{1-y}As$ ($0.1<y<0.5$), an active layer 3 composed of $Al_wGa_{1-w}As$ ($0\leq w<0.3$) and a cladding layer 4 composed of p-$Al_vGa_{1-v}As$ ($0.2<v<0.8$). A burying layer 5 is composed of $Al_uGa_{1-u}As$ ($0.2<u<1.0$).

There is further provided a semiconductor layer 6 which is a GaAs contact layer for facilitating ohmic contact with the electrode. Numerals 11 and 12 refer to the electrodes. The material of these electrodes is not specified in the present invention, but for instance, 11 may be an AuGeNi/Au electrode and 12 may be a Cr/Pt/Au electrode. The active layer 3, the optical guiding layer 2 and the cladding layers 1 and 4 may be of the known LOC structure. The thickness of these layers is not critical, but usually it is selected from within the range of about 0.02 to 0.2 μm for the active layer 3, about 0.03 to 1.0 μm for the optical guiding layer 2 and about 0.2 to 3.0 μm for each of the cladding layers 1 and 4. The stripe width is usually 1 to 7 μm.

The conduction type of each of the active layer and the burying layer may be n-type or p-type, but it is preferably i-type which is not doped with an impurity for conduction type. If necessary, a contact layer may be provided between any adjoining ones of said layers.

Also, in the semiconductor layer element of this example, an active layer made of GaInP may be used.

Figure 3:
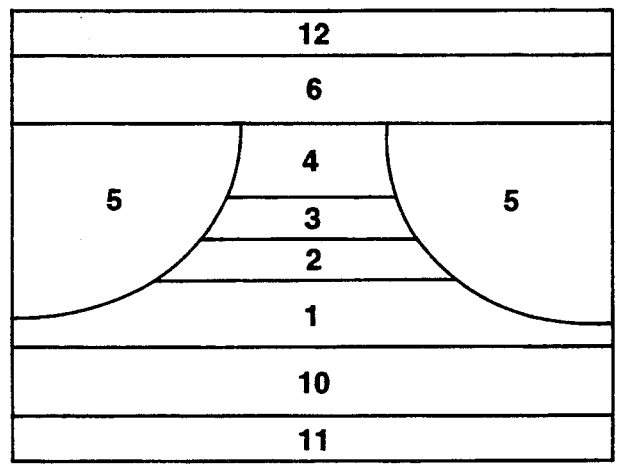
FIG. 3 is a schematic sectional view of another laser element according to the Example 2 of the present invention.

The burying layer 5 is not defined in its thickness as far as it allows efficient light-confinement of the stripe region. In the area near the stripe region, however, this layer is preferably formed to such a thickness that it becomes flush with the top surface of the second cladding layer. The burying layer preferably reaches to part of the first cladding layer (FIG. 3).

It is preferable that the burying layer 5 has a current blocking function for concentrating the applied current in the stripe region, and for this purpose a high-resistance semiconductor layer may be used as the burying layer 5.

In order to satisfy the above-defined relations of refractive index between the respective layers, there should exist a relation of $w<y<x$, and $y<v$ regarding the crystal mixing ratios (ratio of Al to Al and Ga) of the cladding layers, the active layer and optical guiding layer, and a relation of $x<u$, or $v<u$ regarding the crystal mixing ratios of the burying layer and the cladding layers.

In case AlGaInP-based semiconductors are used, there are laminated on an n-GaAs substrate 10 a cladding layer 1 composed of n-$Al_xGa_{1-x}InP$ ($0.2<x<0.7$), a optical guiding layer 2 composed of n-$Al_yGa_{1-y}InP$ ($0.1<y<0.5$), an active layer 3 composed of AlGaInP and a cladding layer 4 composed of p-$Al_uGa_{1-u}Inp$ ($0.2<u<1.0$). Other conditions are the same as in the AlGaAs-based semiconductor laser element described above.

The semiconductor laser element of the present invention can be produced according to the following process.

A first cladding layer, an optical guiding, an active layer and a second cladding layer are grown in this order or in reverse order on a semiconductor substrate by, for example, MOCVD method. Then a film such as a $SiN_4$ film is deposited on the cladding layer by, for example, plasma CVD method. A photoresist is applied on this film and a striped resist pattern is formed by photolithography. With this resist serving as mask, plasma etching is carried out with, for example, $SF_6$, and the resist is removed to form a $SiN_4$ mask.

By using this mask, etching is carried out until the cladding layer closer to the semiconductor substrate or the semiconductor substrate itself is bared out. Then a semiconductor which constitutes a burying layer is formed in the etched away portion by, for example, the MOVCD method in such a manner that the surface of the burying layer portion becomes substantially flush with the stripe portion.

In case of the crystal mixing ratio and the type of the semiconductor used for the burying layer according to the present invention, it may become difficult to carry out selective growth of the burying layer 5 due to a polycrystallization tendency of the layer or a tendency to form a deposit on the mask. Such a problem can be overcome by flowing a small amount (ordinarily 0.1 to 10 sccm, preferably 0.5 to 1 sccm) of an etching gas such as HCl with the layer-forming material gas (ordinarily 30 to 100 sccm).

Thereafter, the mask is removed by wet etching with, for example, fluoric acid, and if necessary another semiconductor layer such as a GaAs layer is provided thereon to obtain a desired semiconductor laser element.

According to the present invention, it is possible to efficiently confine light even in the direction parallel to the layers. It is also possible to reduce the loss in the cavity and to enhance internal quantum efficiency. This enables a reduction of threshold current or driving current and high-output operation of laser.

Further, since light can be efficiently confined even in the direction parallel to the layers, it is possible to independently design the distribution of light in the direction vertical to the layers of the laminated structure and the distribution of light in the direction parallel to the layers, so that the shape of laser beams can be easily controlled and it is possible to make a laser having a circular near or far field pattern.

Proper design of cavity length and stripe width enables multispectral resonance oscillation in the longitudinal mode even at a high output over 30 mW, so that it is possible to make a laser with minimized variation of noise level for the return light.

EXAMPLES

The present invention is described in more detail below in accordance with examples thereof. The following examples are merely intended to be illustrative and should not be construed as limiting the scope of the invention.

The values of the refractive index shown in the examples are those at 900 nm of wavelength.

Example 1

A 1.0 μm thick n-type $Al_{0.4}Ga_{0.6}As$ cladding layer 1 (doped with Si; $n=1\times10^{18}$ cm$^{-3}$; refractive index: 3.34), a 0.1 μm thick n-type $Al_{0.3}Ga_{0.7}As$ optical guiding layer 2 (doped with Si; $n=5\times10^{17}$ cm$^{-3}$; refractive index: 3.40), a 0.05 μm thick undoped GaAs active layer 3 (refractive index: 3.60) and a 1.0 μm thick p-type $Al_{0.5}Ga_{0.5}As$ cladding layer 4 (doped with Zn; $p=1\times10^{18}$ cm$^{-3}$; refractive index: 3.28) were grown in this order on an n-type GaAs substrate 10 (doped with Si; $n=1\times10^{18}$ cm$^{-3}$) by the MOCVD method.

On the resultant wafer, a $SiN_4$ film was deposited by plasma CVD, and a photoresist was applied on this $SiN_4$ film. A resist pattern was formed on the $SiN_4$ film by photolithography for forming a striped pattern. With this resist serving as mask, $SF_6$ plasma etching was carried out and then the resist was removed to form a $SiN_4$ mask with a width of 5 μm.

By using this mask, etching was carried out to the extent that the cladding layer 1 was bared out, thereby forming a ridge stripe. Then, an undoped $Al_{0.6}Ga_{0.4}As$ layer 5 (refractive index: 3.22) was formed in the etched out portion by the MOCVD method so as to substantially make up for the loss by etching, in a manner that the surface of this burying layer would become substantially flat. During this operation, a small amount (0.5 sccm) of HCl was flowed continuously together with the layer-forming material gas (50 sccm) so as to prevent polycrystallization on the mask.

Thereafter, the $SiN_4$ mask was removed by wet etching with fluoric acid, and a 2 μm thick p-type GaAs layer 6 (doped with Zn; $p=2\times10^{19}$ cm$^{-3}$) was grown by the OCVD method.

Then, electrodes were provided to obtain a semiconductor laser element.

Similarly, semiconductor elements having various cavity lengths were produced.

Figure 4:
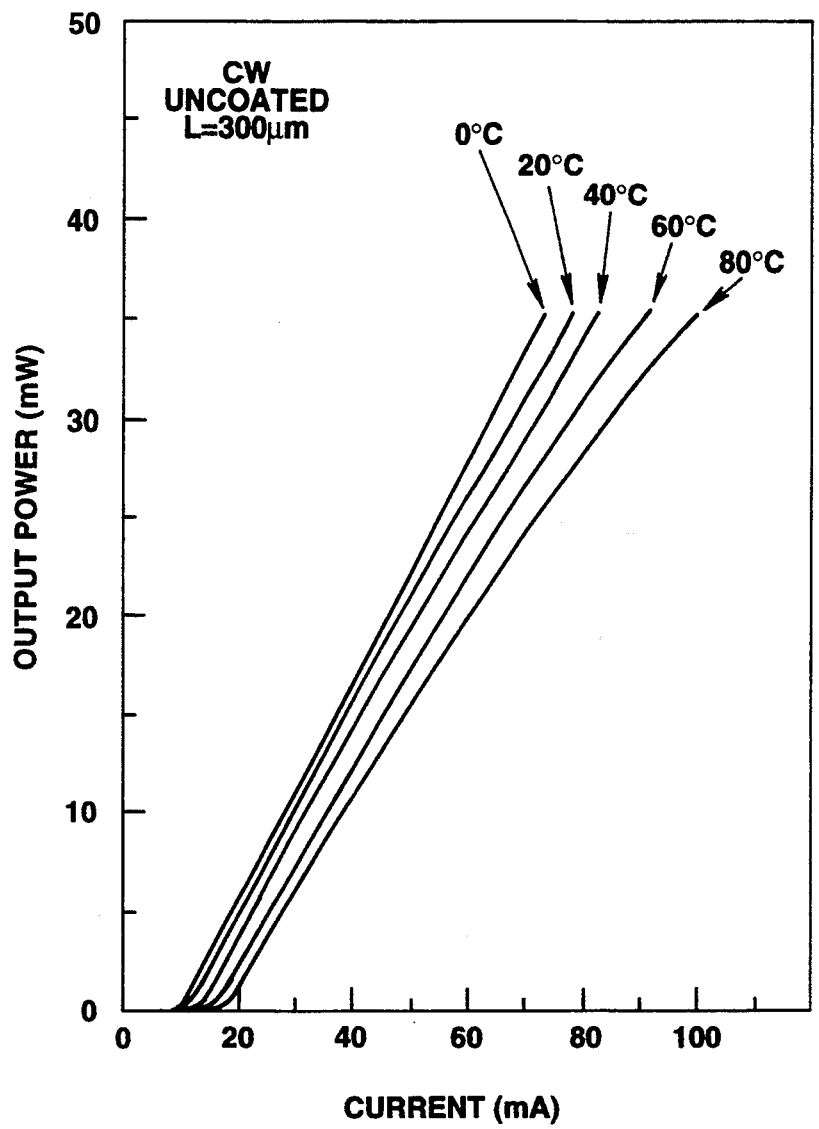
FIG. 4 is a graph showing a relation of the temperature change to current-output power characteristics.
Figure 5:
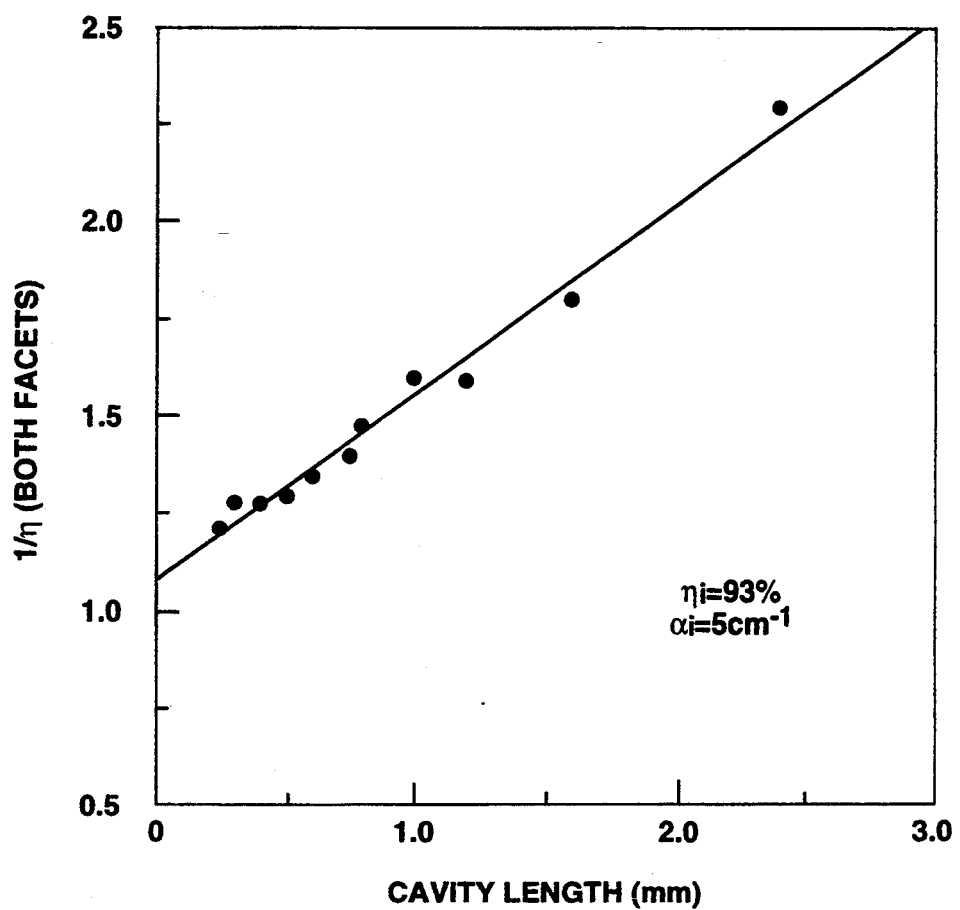
FIG. 5 is a graph showing cavity length dependency of external differential quantum efficiency.

FIG. 4 is a graph showing a relation of temperature change to the current-output power characteristics of the laser with a stripe width of 5 μm and a cavity length of 300 μm. At 20° C. the threshold current was 12 mA and the driving current at 30 mW was 68 mA, and at 80° C., the threshold current was 18 mA, with the driving current at 30 mW was 85 mA. FIG. 5 is a graph showing cavity length dependency of external differential quantum efficiency. The internal differential quantum efficiency ($\eta i$) and the cavity loss ($\alpha i$) as calculated from the intercepts and inclination of the straight line in the graph were 93% and 5 cm$^{-1}$, respectively, which represented an improvement over the conventional AlGaAs laser elements in which $\eta i$ and $\alpha i$ are in the order of 60–90% and 20–30 cm$^{-1}$, respectively.

Example 2

Semiconductor laser elements are produced in the same way as in Example 1 except that the etching is carried out to the extent that part (0.2 μm in thickness) of the first cladding layer 1 is removed.

At 20° C., the threshold current is 10 mA and the driving current at 30 mW is 65 mA, and at 80° C., the threshold current is 16 mA, with the driving current at 30 mW is 80 mA.

The internal differential quantum efficiency ($\eta i$) and the cavity loss ($\alpha i$) are 95% and 4 cm$^{-1}$, respectively.

Comparative Example 1

Semiconductor laser elements are produced in the same way as in Example 1 except that an undoped $Al_{0.3}Ga_{0.7}As$ layer (refractive index: 3.40) is used as the burying layer.

At 20° C., the threshold current is 20 mA and the driving current at 30 mW is 80 mA, and at 80° C., the threshold current is 40 mA, with the driving current at 30 mW is 150 mA.

The internal differential quantum efficiency ($\eta i$) and the cavity loss ($\alpha i$) are 90% and 9 cm$^{-1}$, respectively.

Comparative Example 2

A ridge stripe was formed in the same way as in Example 1. Then, an undoped $Al_{0.6}Ga_{0.4}As$ layer 5 was formed in the etched out portion by the MOCVD method without using HCl.

Since polycrystalline was deposited on the mask during the operation, no semiconductor laser element could not be obtained.

What is claimed is:

1. A semiconductor laser element comprising a first cladding layer, an optical guiding layer, an active layer and a second cladding layer disposed in this order or in reverse order on a semiconductor substrate, a refractive index of the optical guiding layer being larger than both refractive indexes of the first and second cladding layers, and a refractive index of the optical guiding layer is smaller than that of the active layer but larger than that of the first cladding layer, and a burying layer having a refractive index smaller than that of at least one of the first and second cladding layers being disposed on side faces other than laser-emitting faces of the optical guiding layer and the active layer.

2. A semiconductor laser element according to claim 1, wherein the semiconductors used for the first cladding layer, the optical guiding layer, the active layer and the second cladding layer are AlGaAs-based semiconductors.

3. A semiconductor laser element according to claim 1, wherein the semiconductors used for the first cladding layer, the optical guiding layer, the active layer and the second cladding layer are AlGaInP-based semiconductors.

4. A semiconductor laser element according to claim 2, wherein the semiconductor substrate is composed of n-GaAs, the first cladding layer is composed of n-$Al_xGa_{1-x}As$ ($0.2 < x < 0.7$), the optical guiding layer is composed of n-$Al_yGa_{1-y}As$ ($0.1 < y < 0.5$), the active layer is composed of $Al_wGa_{1-w}As$ ($0 \leq w < 0.3$), the second cladding layer is composed of p-$Al_vGa_{1-v}As$ ($0.2 < v < 0.8$) and the burying layer is composed of $Al_uGa_{1-u}As$ ($0.2 < u < 1.0$).

5. A semiconductor laser element according to claim 4, wherein $w < y < x$, and $y < v$; and $x < u$ or $v < u$.

6. A semiconductor laser element according to claim 1, wherein the semiconductor substrate is composed of n-GaAs, the first cladding layer is composed of n-$Al_xGa_{1-x}As$ ($0.2 < x < 0.7$), the optical guiding layer is composed of n-$Al_yGa_{1-y}As$ ($0.1 < y < 0.5$), the active layer is composed of GaInP, the second cladding layer is composed of p-$Al_vGa_{1-v}As$ ($0.2 < v < 0.8$) and the burying layer is composed of $Al_uGa_{1-u}As$ ($0.2 < u < 1.0$).

7. A semiconductor laser element according to claim 6, wherein $w < y < x$, and $y < v$; and $x < u$ or $v < u$.

8. A semiconductor laser element according to claim 3, wherein the semiconductor substrate is composed of n-GaAs, the first cladding layer is composed of n-$Al_xGa_{1-x}InP$ ($0.2 < x < 0.7$), the optical guiding layer is composed of n-$Al_yGa_{1-y}InP$ ($0.1 < y < 0.5$), the active layer is composed of GaInP, the second cladding layer is composed of p-$Al_vGa_{1-v}InP$ ($0.2 < v < 0.8$) and the burying layer is composed of $Al_uGa_{1-u}InP$ ($0.2 < u < 1.0$).

9. A semiconductor laser element according to claim 8, wherein $w < y < x$, and $y < v$; and $x < u$ or $v < u$.

10. A semiconductor laser element according to claim 1, wherein the refractive index of the burying layer is smaller than that of the first cladding layer.

11. A semiconductor laser element according to claim 1, wherein a thickness of the active layer is 0.02 to 0.2 μm, a thickness of the optical guiding layer is 0.03 to 1.0 μm, and thicknesses of the cladding layers are each independently 0.2 to 3.0 μm.

12. A process for producing a semiconductor laser element as defined in claim 1, which comprises laminating a first cladding layer, an optical guiding layer, an active layer and a second cladding layer in this order or in reverse order on a semiconductor substrate, providing a mask on the laminated layers, carrying out etching, and forming a burying layer in the etched out portion, a small amount of an etching gas being flowed together with a layer-forming material gas continuously or intermittently during the forming of the burying layer.

* * * * *